United States Patent
Fomenkov et al.

(10) Patent No.: US 6,493,374 B1
(45) Date of Patent: *Dec. 10, 2002

(54) SMART LASER WITH FAST DEFORMABLE GRATING

(75) Inventors: Igor V. Fomenkov, San Diego, CA (US); Frederick G. Erie, Encinitas, CA (US); Jesse D. Buck, San Marcos, CA (US); Palash P. Das, Vista, CA (US)

(73) Assignee: Cymer, Inc., San Diego, CA (US)

(*) Notice: Subject to any disclaimer, the term of this patent is extended or adjusted under 35 U.S.C. 154(b) by 34 days.

This patent is subject to a terminal disclaimer.

(21) Appl. No.: 09/703,317

(22) Filed: Oct. 31, 2000

Related U.S. Application Data

(63) Continuation-in-part of application No. 09/390,579, filed on Sep. 3, 1999, now Pat. No. 6,212,217.

(51) Int. Cl.[7] .............. H01S 3/08; H01S 3/22; H01S 3/223
(52) U.S. Cl. .............. 372/102; 372/57; 372/99
(58) Field of Search ............... 372/20, 32, 57, 372/99, 102

(56) References Cited

U.S. PATENT DOCUMENTS 6,212,217 B1 * 4/2001 Erie et al. ............... 372/102

* cited by examiner

*Primary Examiner*—Quyen Leung
*Assistant Examiner*—Davienne Monbleau
(74) *Attorney, Agent, or Firm*—John R. Ross

(57) ABSTRACT

A smart laser having automatic computer control of pulse energy, wavelength and bandwidth using feedback signals from a wavemeter. Pulse energy is controlled by controlling discharge voltage, wavelength by controlling the position of an $R_{MAX}$ mirror and bandwidth is controller by adjusting the curvature of a grating to shapes more complicated than simple convex or simple concave. A preferred embodiment provides seven piezoelectric driven pressure-tension locations on the back side of the grating at 5 horizontal locations to produce shapes such as S shapes, W shapes and twisted shapes. Preferred embodiments include automatic feedback control of horizontal and vertical beam profile by automatic adjustment of a prism plate on which beam expander prisms are located and automatic adjustment of the $R_{MAX}$ tilt.

22 Claims, 13 Drawing Sheets

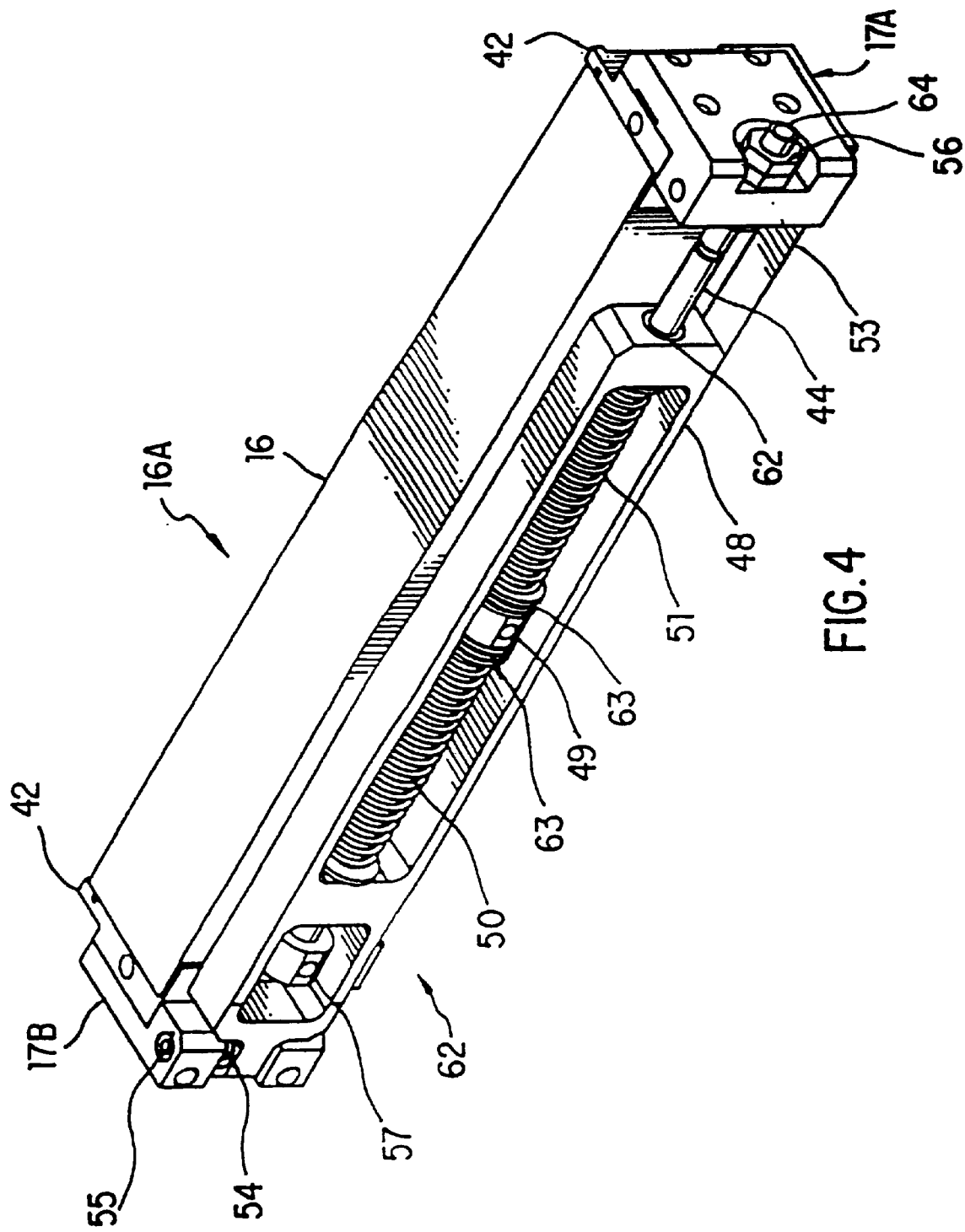

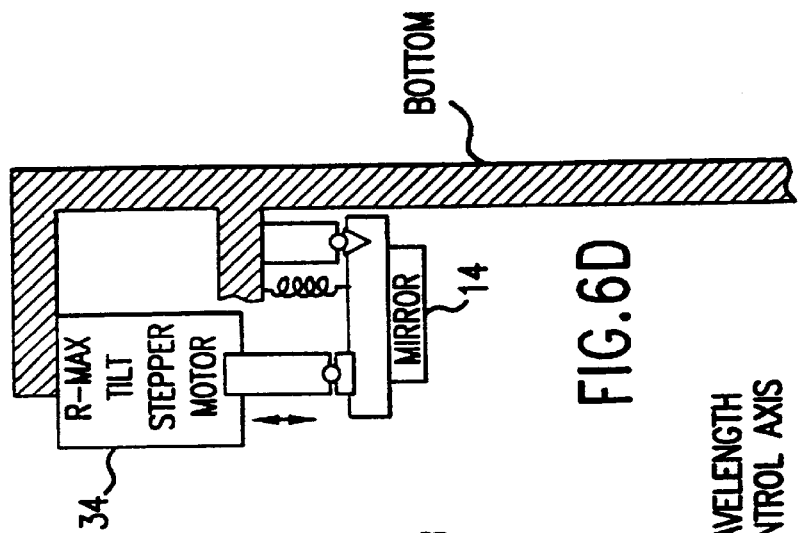
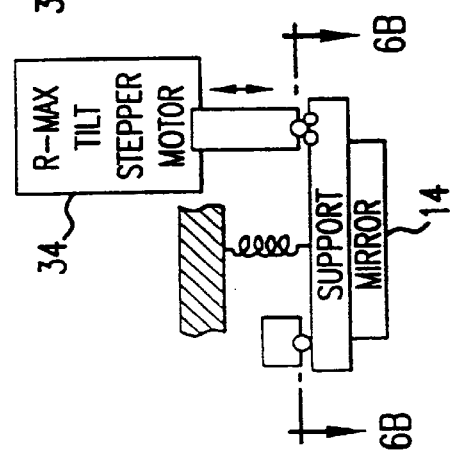
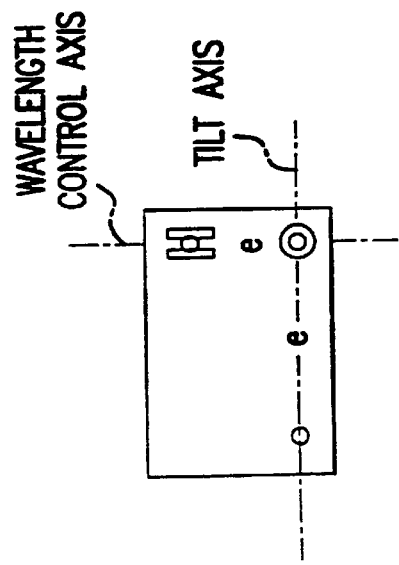
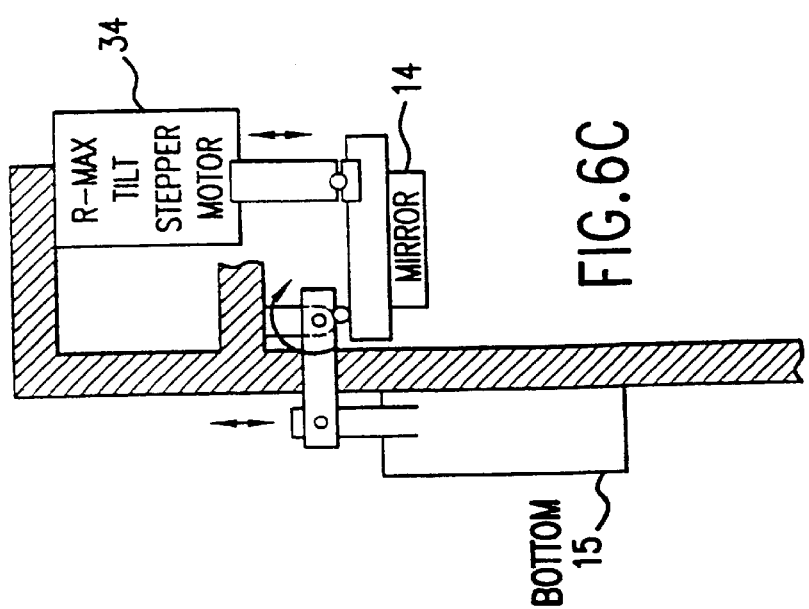
FIG. 6A
FIG. 6B
FIG. 6C
FIG. 6D

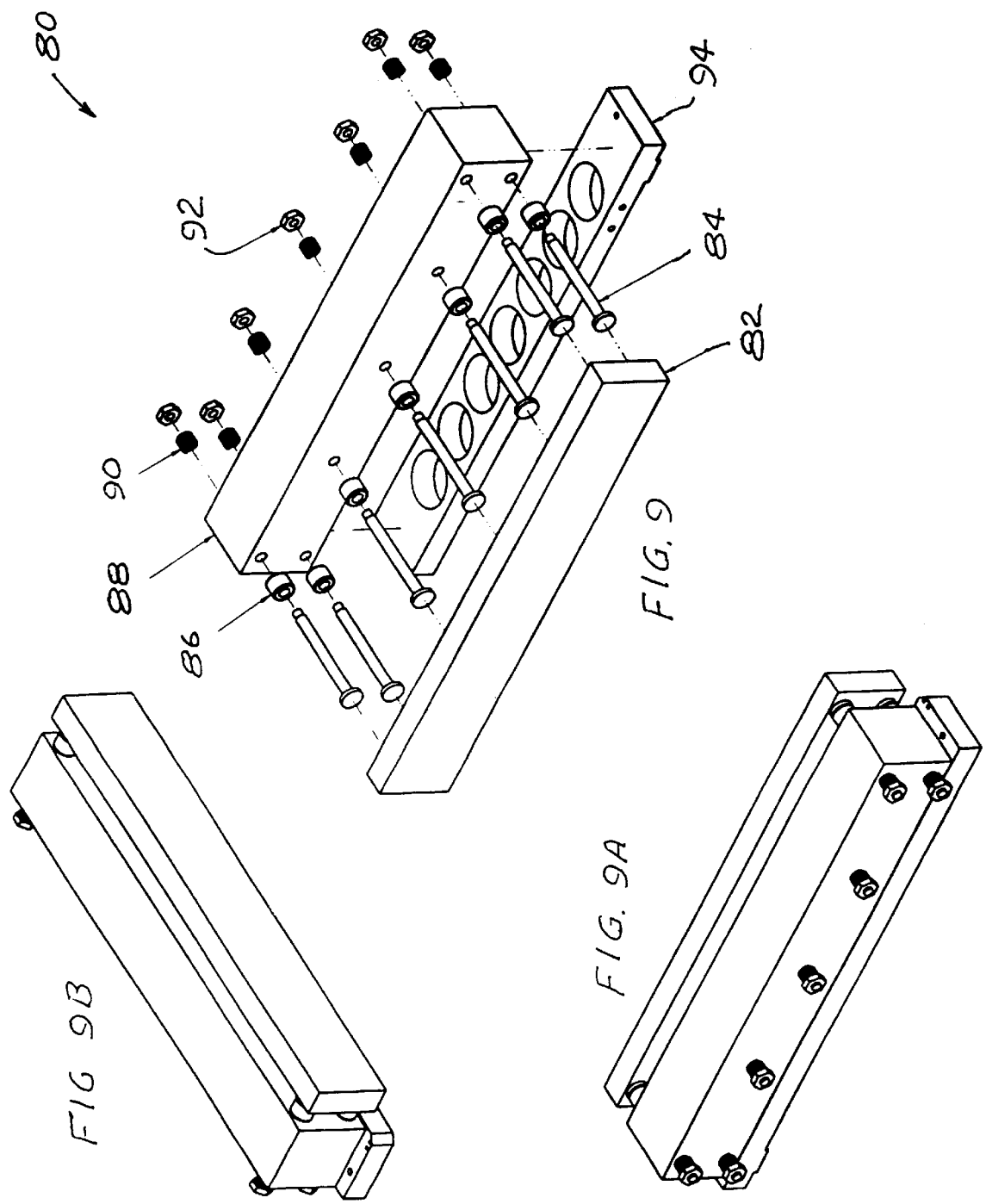

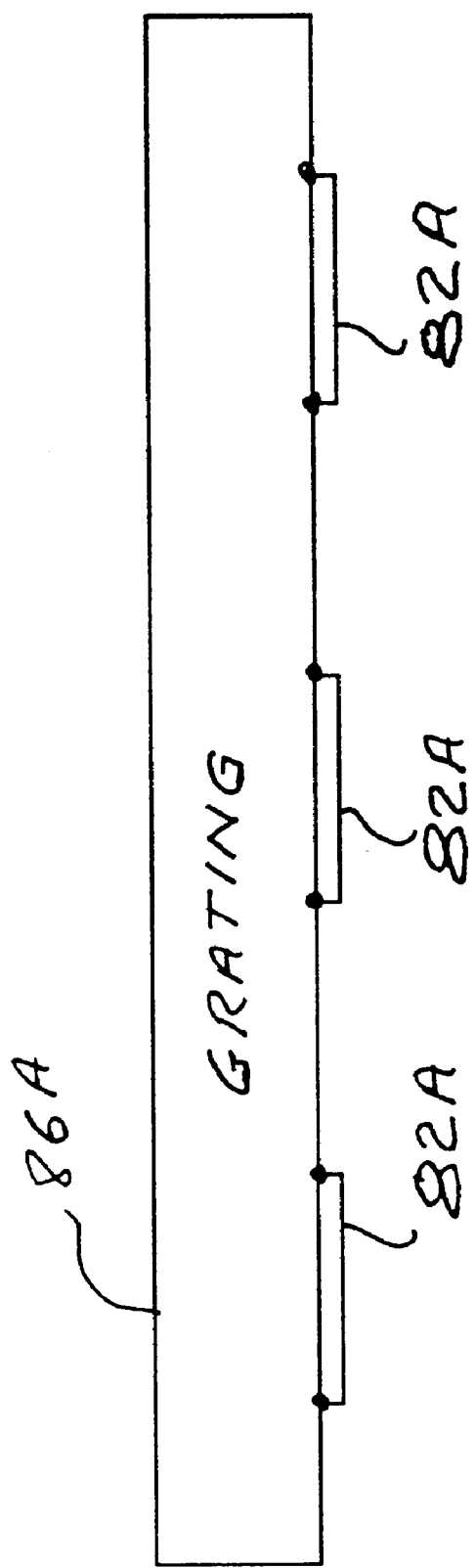

SMART LASER WITH FAST DEFORMABLE GRATING

This is a continuation-in-part application of Ser. No. 09/390,579; filed Sep. 3, 1999 now U.S. Pat. No. 6,212,217. This invention relates to lasers and in particular to lasers with feedback control of beam quality.

BACKGROUND OF THE INVENTION

In many laser applications precise control of beam output is desired. One such application for such lasers is the light source for integrated circuit lithography. Currently the KrF excimer laser is the choice light source for state of the art integrated circuit lithography devices. Specifications for the light source are becoming tighter as efforts are made to increase production and produce finer integrated circuit patterns.

Typical specifications for a 248 nm KrF laser call for bandwidths of about 0.6 pm full width half maximum, wavelength stability within 0.1 pm of the specified wavelength and energy dose stability of about ±0.5 percent. In addition, control of beam cross section intensity values are important.

FIG. 1 shows some of the features of a prior art KrF excimer laser system used for IC lithography. The system includes a laser frame structure 5 within which is mounted a laser chamber 3 containing two elongated electrodes (not shown) between which is a gain medium, a line narrowing module (referred to as a "line narrowing package" or LNP) 7 shown disproportionately large and an output coupler 4. The LNP portion of FIG. 1 represents a top view of the LNP. The beam cross section is generally rectangular, typically about 3.5 mm wide and about 15 mm high. In prior art devices each of the line narrowing module 7 and the output coupler module 4 comprise frames which are fixedly mounted to laser frame structure 5. Optical components within the frames of the output coupler module and the line narrowing module are adjusted manually to define the laser resonant cavity. The chamber is adjustably mounted within the laser frame so that it can be finely positioned manually within the defined resonant cavity from time to time in the direction of the beam width as shown by arrows 3A on FIG. 1. These adjustments permit a laser technician to align the resonance cavity with the gain medium in order to achieve optimum beam output parameters. In this prior art for example, a three prism beam expander 18 is comprised of prisms 8, 10 and 12 mounted on prism plate 13. In the prior art device, prism plate 13 can be manually adjusted in the direction of arrows 13A as an alignment technique. The prior art device also includes a manual adjustment of the curvature of the surface of grating 16 into an increasingly or decreasingly concave shape by expanding or contracting bending mechanism 20 to place larger or smaller compressive forces on legs 17A and 17B. The adjustment is done primarily to control bandwidth of the output beam. Another prior art technique for forcing a concave shape on the grating surface is described in U.S. Pat. No. 5,095,492.

Typical prior art lithography excimer lasers now in use incorporate two automatic feedback controls to regulate pulse energy and nominal wavelength. Pulse energy is controlled in a feedback system by measuring the output pulse energy with a beam output monitor 22 as shown in FIG. 1 and then using these measurements with a computer controller 24 to control the high voltage applied between the electrodes in order to regulate pulse energy within desired limits. The beam output monitor 22 (also called a wavemeter) also measures the nominal or center wavelength and bandwidth of the pulsed output beam. Computer controller 24 adjusts the pivot position of tuning mirror 14 using stepper motor 15 in order to control the nominal wavelength of the beam to within desired limits.

What is needed are improvements which will provide easier, faster and more precise control of laser beam output parameters.

SUMMARY OF THE INVENTION

The present invention provides a smart laser having automatic computer control of pulse energy, wavelength and bandwidth using feedback signals from a wavemeter. Pulse energy is controlled by controlling discharge voltage, wavelength by controlling the position of an $R_{MAX}$ mirror and bandwidth is controller by adjusting the curvature of a grating to shapes more complicated than simple convex or simple concave. A preferred embodiment provides seven piezoelectric driven pressure-tension locations on the back side of the grating at 5 horizontal locations to produce shapes such as S shapes, W shapes and twisted shapes. Preferred embodiments include automatic feedback control of horizontal and vertical beam profile by automatic adjustment of a prism plate on which beam expander prisms are located and automatic adjustment of the $R_{MAX}$ tilt. Other preferred embodiments include automatic adjustment of the horizontal position of the laser chamber within the resonance cavity.

BRIEF DESCRIPTION OF THE DRAWINGS

FIG. 4 shows a prospective view of the bending mechanism.

FIGS. 6A, B, C and D show other features of the FIG. 2 embodiment.

FIGS. 9, 9A, 9B, 9C, 9D, 9E and 9F are drawings of a deformable grating.

DETAILED DESCRIPTION OF THE PREFERRED EMBODIMENTS

Preferred embodiments of the present invention can be described by reference to the drawings.

Smart Laser

Figure 1:
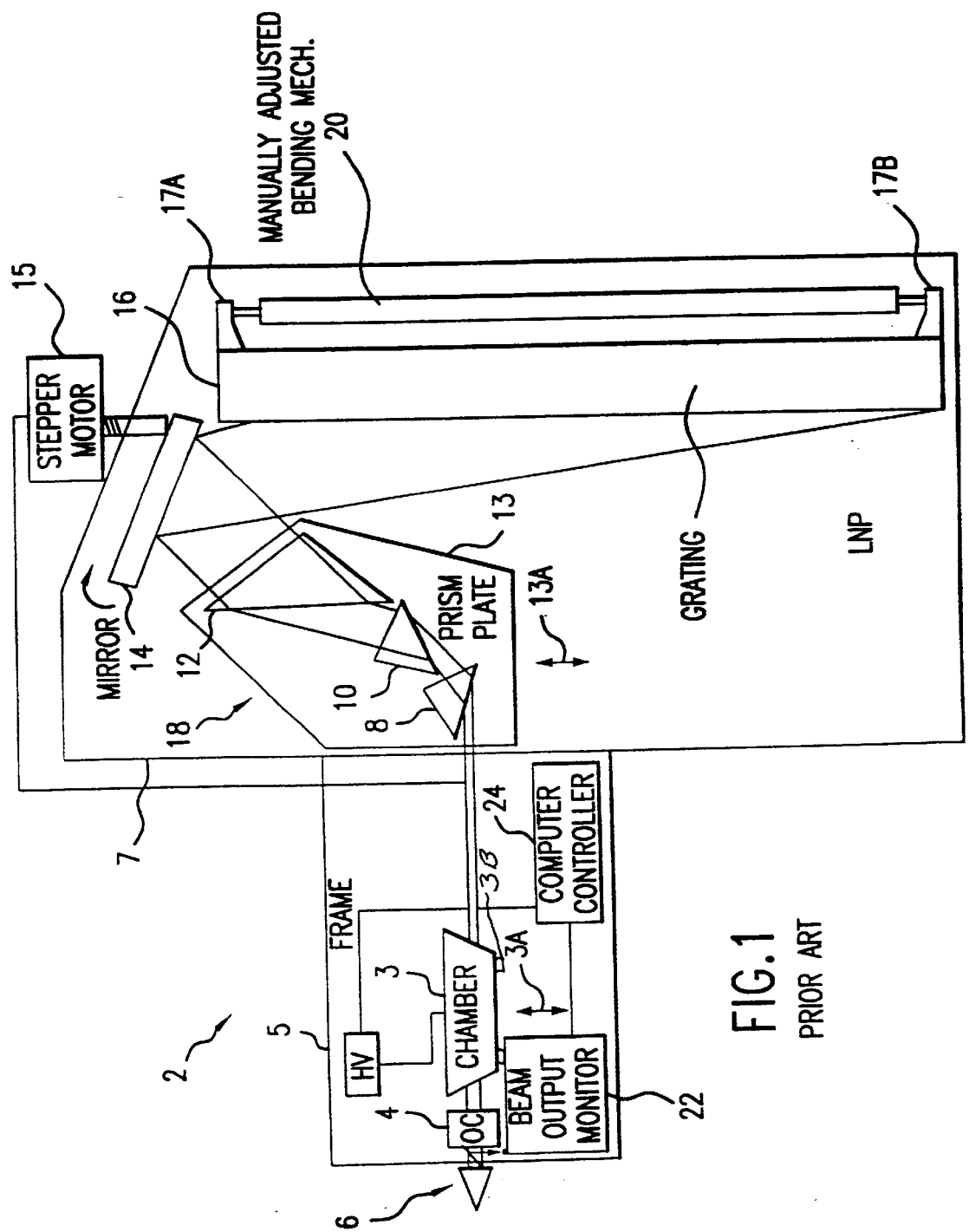
FIG. 1 shows a prior narrow band art laser configuration.
Figure 2:
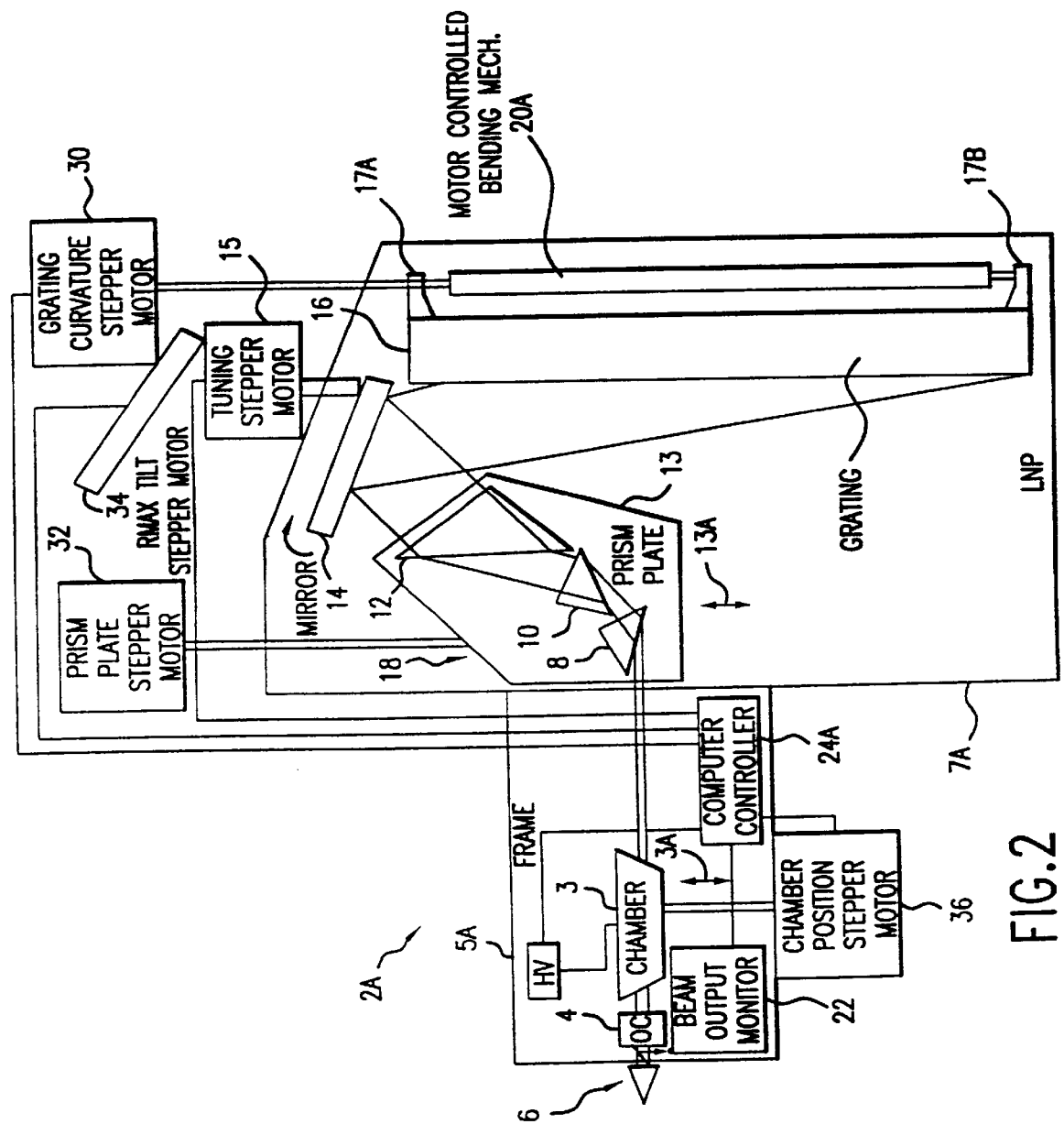
FIG. 2 shows a preferred embodiment of the present invention.

A combination block diagram schematic drawing of a smart laser system is shown in FIG. 2. This drawing shows important improvements over the prior art which automate the alignment of the laser chamber and components in order to provide greatly improved instant control of the important laser beam parameters. The new laser frame 5A has added on to it a chamber position stepper motor to automatically adjust the horizontal position of the chamber in the direction 3A. The LNP 7A includes a prism plate stepper motor 32, an R-max tilt stepper motor 34 and a grating curvature motor 30. All of these stepper motors are controlled by computer controller 24A.

Two-Way Automatic Control of Grating Surface Curvature

A grating curvature stepper motor 30 has been added to control the curvature of grating 16. The system includes a new bending mechanism design 20A which has the capacity to apply either a compressive force to spread apart legs 17A and 17B to create a concave curvature in the lined surface of grating 16 or a tension force to pull tog ether legs 17A and 17B to crate a convex curvature in the lined surface of grating 16. Control of motor 30 is provided by computer controller 24.

Figure 3A:
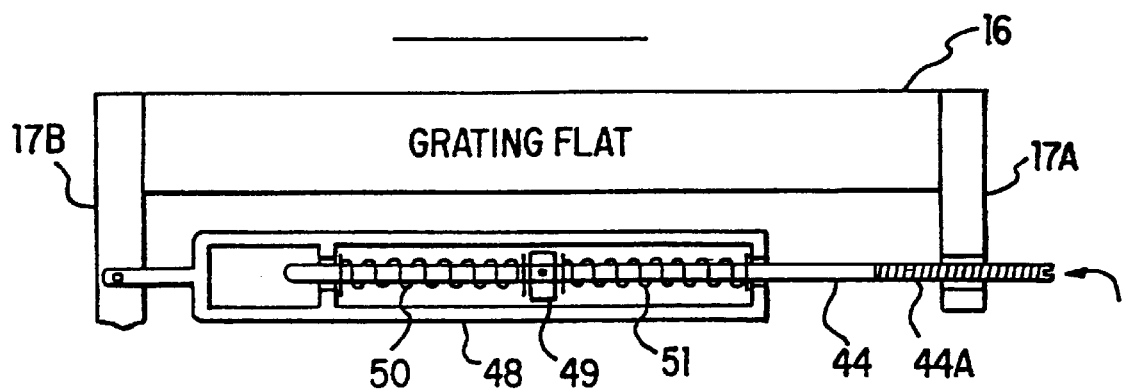
FIGS. 3A, B and C show the operational principals of a grating bending mechanism.
Figure 3B:
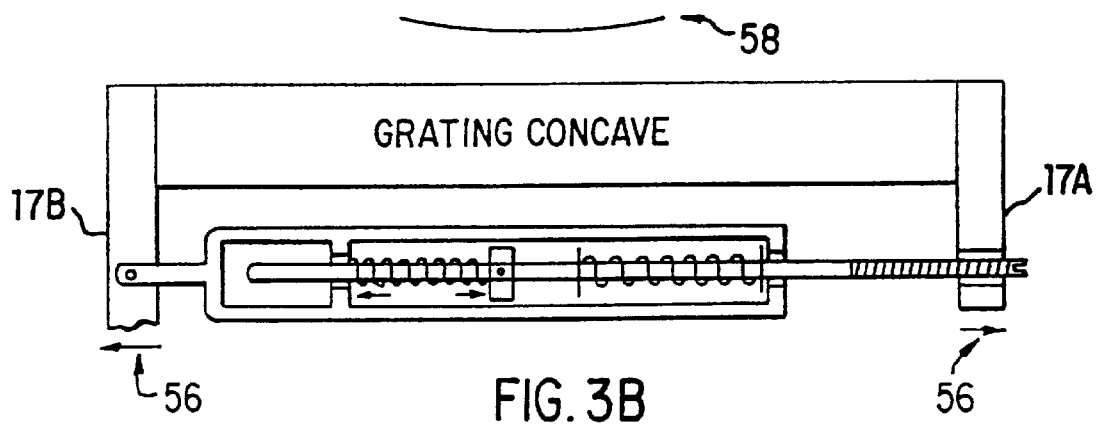
Figure 3C:
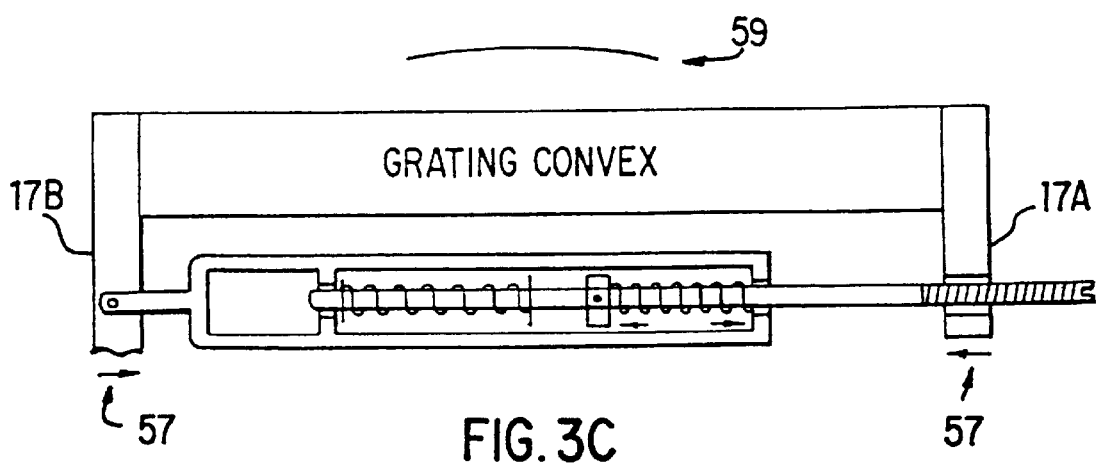

The basic elements and a functional description of the operation of the grating bending mechanism is shown in FIGS. 3A, 3B and 3C. FIG. 3A shows a grating assembly having a bidirectional control unit attached to it but with no bending force applied to the grating. Shown are grating 16, left end plate 17B, right end plate 17A, compression spring housing 48, left compression spring 50, right compression spring 51, adjustment shaft 44 and piston 49 which is fixedly pinned to adjustment shaft 44. Adjustment shaft 44 comprises threaded length 44A (¼-28 UNF-2B×1.38 long) which mates with threaded channel in right end plate 17A. In the FIG. 3A condition, both springs are applying equal compressive force which offset each other or both springs may be unloaded. The curvature of the grating surface is adjusted by turning shaft 44. By screwing shaft 44 in to housing 48, left compression spring 50 is compressed against the left side of housing 48 and piston 49 as shown by the two arrows inside housing 48 in FIG. 3B. The compression force pushes rod 44 to the right and housing 48 to the left which has the effect of pushing apart the two end plates 17A and 17B as shown by arrows 56. This has the effect of bending the surface of grating 1 into a simple concave shape as shown by line 58.

Conversely, by screwing shaft 44 in a direction to drive rod 44 out of housing 48, right compression spring 51 is compressed against the right side of housing 48 and piston 49 as shown by the two arrows in side housing 48 in FIG. 3C. The compressive force pulls rod 44 to the left and pulls housing 48 to the right which has the effect of pulling end plates 17A and 17B together as shown by arrows 57. This has the effect of bending the surface of grating 1 into a simple convex shape as shown by line 59.

In this system rod 44 has 28 threads per inch and the springs are rated at 52 pounds per inch. Operators are able with this design to make extremely fine adjustments to the curvature of the grating surface.

FIG. 4 is a perspective view of a grating assembly 16A fabricated by Applicants and their co-workers. The assembly is comprised of grating 16, two grating end plates 42 (bonded to grating 16) right bidirectional bandwidth control end plate 17A, lock nut 56, invar base plate 53 bonded to grating 16, alignment rod 44, socket 64, two linear bearings 62, compression spring housing 48, right compression spring 51, two thrust bearings 63, piston 49 pinned to rod 44, left compression spring 50, travel limiting piston 57 pinned to rod 44, radial ball bearing 54, pivot shaft 55 and left bandwidth control end plate 17B.

Figure 5:
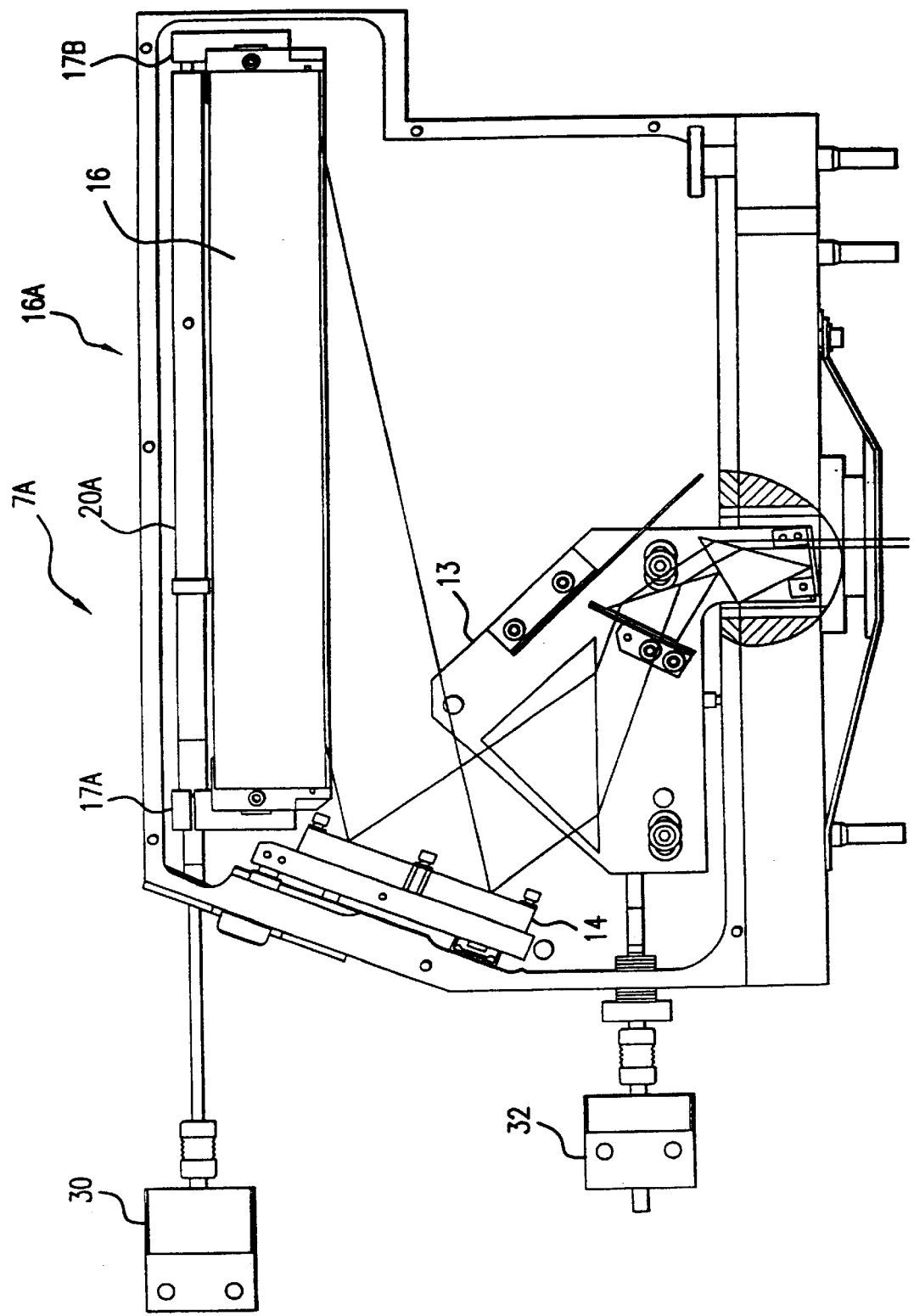
FIG. 5 shows some of the features of the FIG. 2 preferred embodiment.

FIG. 5 is a cutaway drawing of LNP 7A. It shows the two-way curvature-controlled grating assembly 16A. Also shown is grating curvature control stepper motor 30 for controlling the curvature of the lined surface of grating 16 from concave to convex as explained above with reference to FIGS. 3A, 3B and 3C. FIG. 5 also shows prism plate adjustment motor 32. Motor controls for $R_{MAX}$ mirror 14 are not shown in FIG. 5.

Figure 7B:
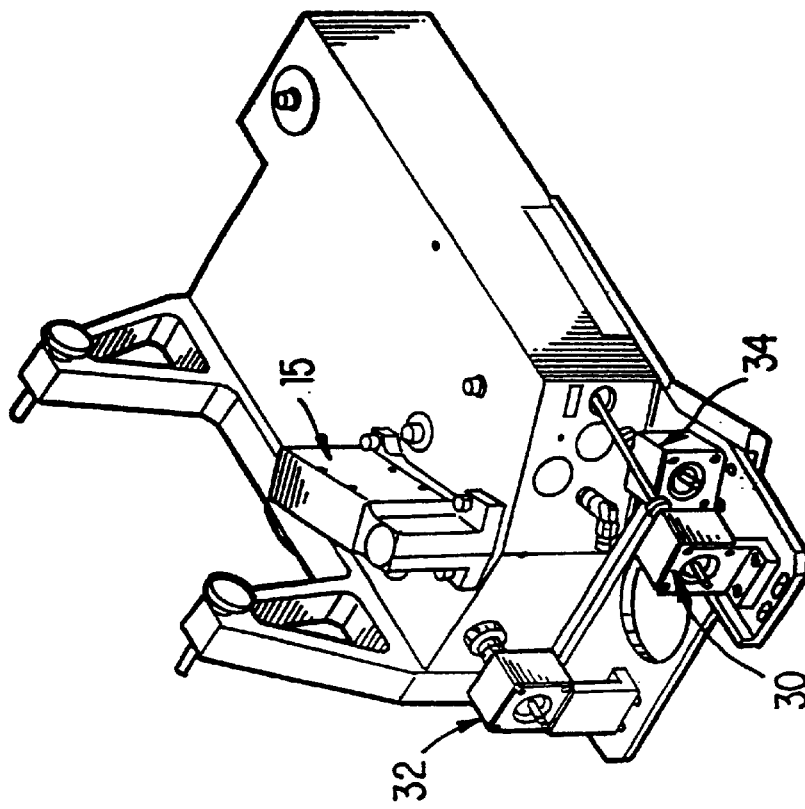
FIGS. 7A and B show bottom prospective views of the line narrowing module of the FIG. 2 embodiment.
Figure 7A:
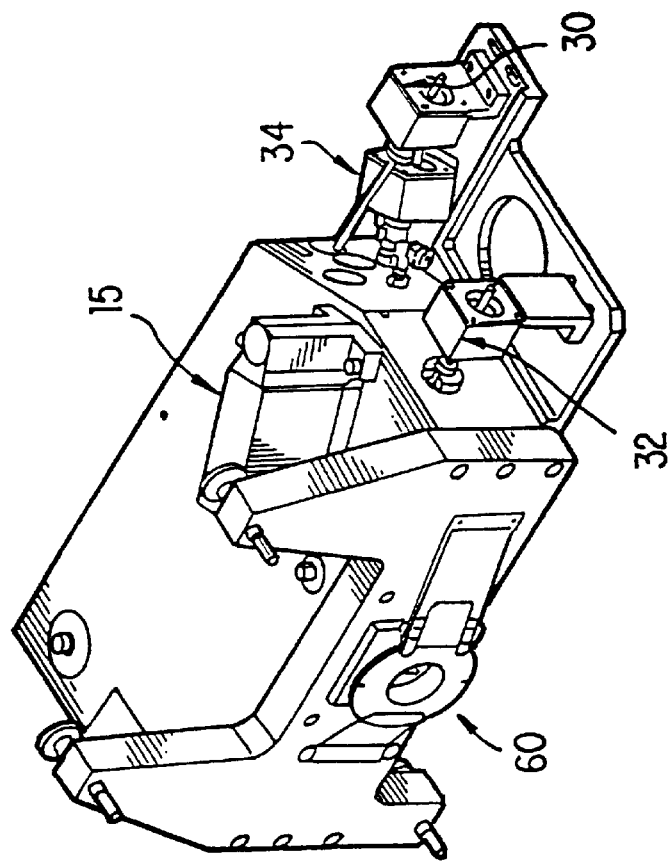

Bottom views of line narrowing package 7A are shown in FIG. 7A (from the front, i.e., looking from the laser toward the LNP) and in FIG. 7B (from the rear). Grating curvature stepper motor 30 is shown mounted on its mounting plate. Prism plate motor is shown at 32 and $R_{MAX}$ tilt motor is shown at 34 and $R_{MAX}$ stepper motor is shown at 15. The beam entrance-exit port for the LNP is shown at 60.

Prism Plate Position Control

Position control of prism plate 13 is depicted in cutaway drawing which also shows prism plate stepper motor 32. Stepper motor 32 is also shown in FIGS. 7A and 7B mounted on its mounting plate. Control of motor 32 is provided by computer controller 24.

Automatic $R_{MAX}$ Tilt Control $R_{MAX}$ tilt control stepper motor is shown at 34 in FIGS. 7A and 7B and 6A, C and D. The tilt of $R_{MAX}$ mirror 14 is provided by $R_{MAX}$ stepper motor 34 which is also controlled by computer controller 24. The tilt of mirror 14 determines the vertical angle of light reflecting in the resonance cavity.

Wavelength Selection with Tuning Mirror

In this system, wavelength selection is provided with stepper motor 15 setting the pivotal horizontal position of tuning mirror 14 based on direction from computer controller 24 which utilizes feedback wavelength information from wavemeter 22 in accordance with prior art techniques as discussed in the background section of this specification.

Automatic Chamber Position Control

This system includes chamber position stepper motor 36 shown in FIG. 2 which automatically adjusts relative to frame 5A (on which is mounted output coupler 4 and line narrowing package 7A) the horizontal position of laser chamber 3 (and thus the horizontal position of the gain medium contained therein) in the direction perpendicular to the direction of beam 6. Preferably two stepper motors 3B are provided one positioned near the output (front) end of the chamber and the other near the LNP (back) end of the chamber. These two motors permit a chamber angular alignment of the axis of the discharge region with the optical axis of the laser system.

Controls

Computer controller is preferably programmed with control algorithms which control motors 36, 32, 34, 30 in addition to 15 in order to maintain beam parameters within desired ranges based on feedback signals from wavemeter 22. A simple approach is to hold all positions constant except one (for example chamber position stepper motor) and scan that item over a predetermined range to seek the position producing the optimum beam performance looking at parameters such as pulse energy output, pulse energy stability and bandwidth. The computer can be programmed to make these scans on operator instruction or to do the scans on a predetermined periodic basis. The computer could also be programmed to make one or more of these types of scans, seeking optimum position, if wavemeter detects a deterioration of any beam quality.

Also during burst mode operation of the laser (where, for example, the laser is operated to produce bursts of pulses such as 300 pulses at a rate of 1000 pulses per second followed by a downtime of 0.3 seconds) beam parameters are known to vary as a function of pulse number (i.e., time after the start of the bursts). In order to moderate or compensate for these variations, the computer controller could be programmed to adjust one or more of the stepper motors as a function of time after the start of the bursts.

Specific Optimization Techniques

In one preferred performance optimization technique a figure of merit M is defined in order to judge optimum laser performance. Adjustments are then made to maximize the value of the figure of merit. This value is computed using input from sensors which measure the beam in real time. These sensors typically provide values such as energy stability, laser efficiency (energy out for voltage in), bandwidth, beam width, beam symmetry, pointing stability, etc. In general the best figure of merit will combine the several parameters which are most important for determining success in the application, such as lithography exposure. For example if only laser efficiency as measured by pulse energy/charging voltage (E) was considered important to the figure of merit would be M=pulse energy/charging voltage, or

M=E

If spacial symmetry (in the horizontal direction), SH, is to be judged in addition E, then S should be measured and given a weighting factor, $W_{SH}$. Perfect symmetry would be zero. The new formula for figure of merit would then be:

$$M=E-(W_{SH})(SH)$$

Adjustments would then be made to maximize M. Similarly the figure of merit M could be made a function of other parameters such as vertical symmetry (VS), bandwidth (B), wavelength stability (WS) and dose stability (DS). In this case the formula for M would be:

$$M=E-(W_{SH})(SH)-(W_{SV})(SV)-(W_B)(B)-(W_{WS})(WS)-(W_{DS})(DS)$$

Again, the computer is programmed to make adjustments to the stepper positions, measure E, SH, SV, B, WS and DS, apply weighting factors to achieve maximum figures of merit M.

Many techniques are well known for optimizing laser performance where several parameters of the type discussed above are considered. One preferred embodiment is the downhill simplex method which is documented in the book *Numerical Recipes, The Art of scientific Computing* by W. H. Press, et al., Cambridge University Press 1990 and referenced therein. In brief, a group of initial settings is chosen for the adjustments. There will be a number of configurations (a configuration is a set of values for the adjustments) which is one greater than the number of parameters being adjusted. For one iteration, the adjustments are set to each configuration and the figure of merit is measured. The configuration with the worst merit is then rejected and replaced with a new configuration which is closer to the best configuration. As the iterations proceed, the configurations become closer to one another until any one of them may be chosen as the optimum. In early work, Applicants have found that about 10 iterations suffice to locate the optimum. The downhill simplex method is a reliable technique, however, if very rapid convergence is needed other well known techniques could be utilized.

An Example of an Optimization Technique

The merit function M should be chosen so that adjusting the laser to obtain higher values of M will mean more effective operation, which could mean lower operational costs and/or higher optical performance in the application. Defining the "best" formula for M is a question that would require considerable research to determine, but it is not difficult to invoke a reasonably useful definition. For example, we may assume that energy efficiency (E/V) and bandwidth (E95) are of primary interest, then we can represent a reasonable merit function as $$M=(E/V)-W*E95$$

Where M is the value of the merit function, E/V is the efficiency in mJ per volt, W is a weighting factor to adjust the relative sensitivity of the merit function to efficiency versus bandwidth, and E95 is the laser bandwidth defined by the 95% integral width criterion.

Now assume that we have four adjustments to optimize on the laser, such as grating curvature (BCD), R-max tilt (RMAX), and chamber position (CH-front and CH-rear). This will constitute a multi-variable optimization process and in general we must expect interactions among the adjustments, so that for example the best setting for BCD will depend on the current adjustment for the RMAX. There are many standard algorithms for dealing with multi-variable optimization, such as the downhill simplex method or fuzzy logic approaches, which have some important practical advantages. For illustrative purposes in the present discussion, we will describe an approach which adjusts the controls one at a time, sometimes referred to as a grid search algorithm.

Assume that the laser is in an initial alignment state which is only required to be good enough so that the laser is functioning to allow the efficiency and bandwidth to be measured. Then assuming that we choose to optimize the BCD adjustment first:

1) compute the merit function value in the starting alignment
2) adjust the BCD by an amount D, where the size of D is chosen from experience to have a moderate effect on laser performance (i.e., a change big enough that it is not masked by measurement noise)
3) if the merit function improves after step 2, continue adjusting the BCD in increments of D until it gets worse
4) if the merit function gets worse after step 2, then continue adjusting the BCD in increments of −D until it gets worse.
5) At this point there will be 3 consecutive settings of the BCD, denoted D1, D2, and D3, with 3 values of the merit function M1, M2, and M3, where the middle value M2 is better than the first M1 or last M3. In general the best setting will not coincide with D2. We then use inverse parabolic interpolation to estimate the best setting using the formula:

$$D_{optimum} = D_2 - \frac{1}{2} * \frac{(D_2-D_1)^2[M_2-M_3]-(D_2-D_3)^2[M_2-M_1]}{(D_2-D_1)[M_2-M_3]-(D_2-D_3)[M_2-M_1]}$$

and then set the BCD adjustment to $D_{optimum}$. While it would be simpler to set the BCD to D2, computing the optimum in this way can significantly improve the results.

For the remaining adjustments, go to step 1, substituting each remaining adjustment (RMAX, CH-front, CH-rear) in turn where BCD is specified.

After all the adjustments have been optimized one at a time, then the adjustment increment D is reduced by some factor, for example, dividing by 2, for each of the adjustments, and this cycle is repeated. This is continued until the adjustment increment D becomes smaller than a predetermined level, and at this point the laser adjustment has been optimized.

Preferably, the optimization program will also be configured to keep beam parameters within specification. This can be done by providing an additional routine which checks the important quality parameters from time to time and if any go out of specification, the settings are adjusted to bring the out of specification parameter back within specification.

Measurement of Additional Beam Parameters

Figure 8:
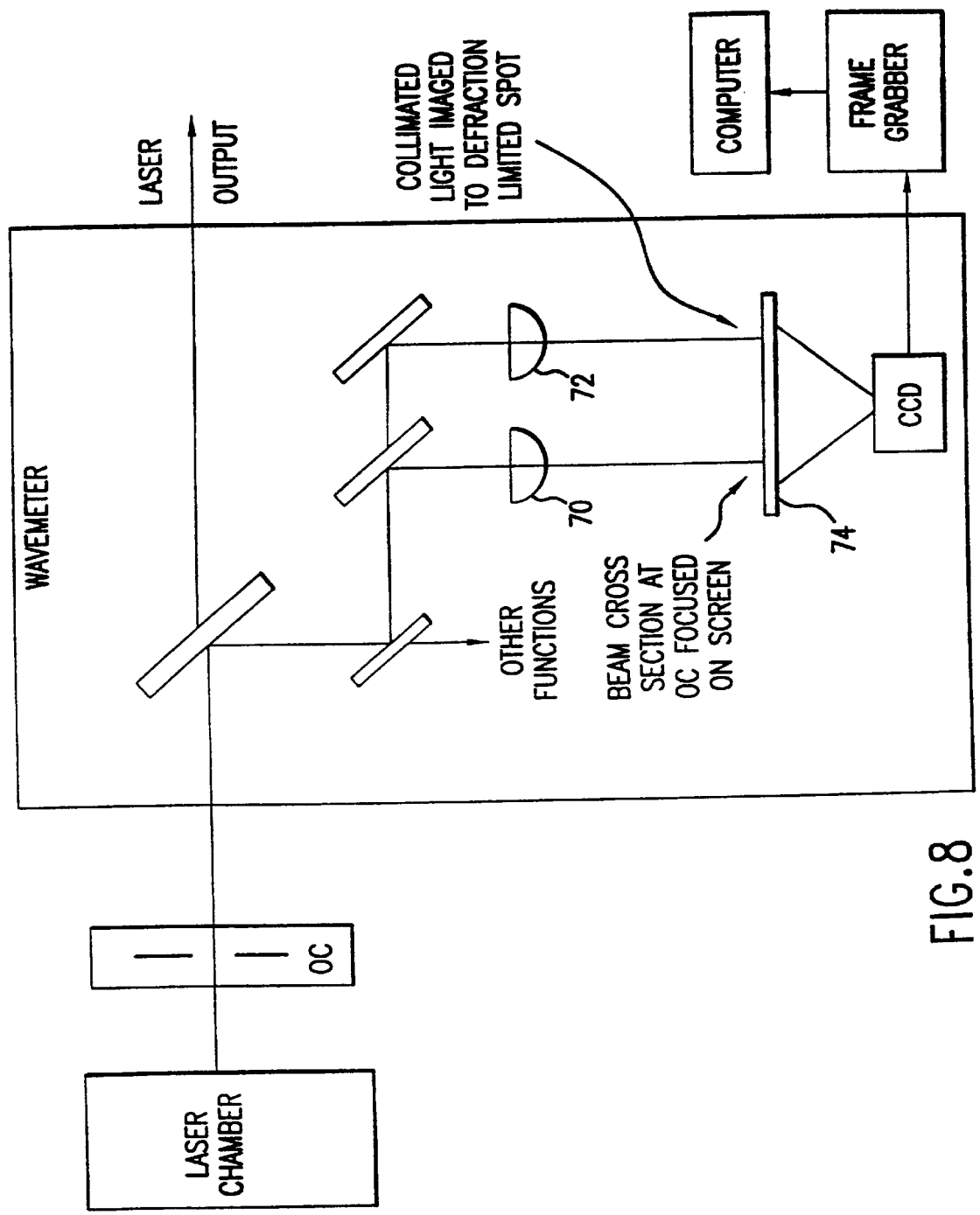
FIG. 8 shows an optical setup for measuring selected beam parameters.

In order to measure various beam parameters, Applicants provided the optical setup described in FIG. 8. An image of the laser beam at the output coupler aperture was relayed optically through lens 70 to a fluorescent screen and beam parameters including vertical and horizontal symmetry were determined utilizing a CCD camera focused on fluorescent screen 74 as shown in FIG. 8. The fluorescent screen converts the UV light from the laser to visible light which is monitored by the CCD camera. The analog output from the camera is converted to digital with a video frame grabber and the output of the frame grabber is analyzed by a computer processor.

Applicants in conjunction with this work were also able to monitor beam divergence, beam pointing and beam pointing stability with a second beam path through lens 72 as shown in FIG. 8. In this case, lens 72 focuses the laser beam onto the fluorescent screen 74 and is located so that perfectly colluminated light entering the lens would appear as a diffraction limited spot at the fluorescent screen. Therefore, the size of the spot is a measure of the divergence of the beam and movement of the spot is a measure of changes in beam pointing. These additional parameters could be used with the present invention to optimize laser performance taking into consideration these parameters.

PZT Deformable Grating

FIG. 9 shows a perspective view of the principal elements of a piezoelectric driven deformable grating assembly 80 for providing much greater control over the surface curvature of the grating as compared with the simple convex and simple concave curved surfaces produced by the FIG. 4 mechanism and also the potential for very rapid response times. The embodiment includes a grating 82 having dimensions of 12.7×35×250 mm and having a grating substrate comprised of ULE material. The grating surface is prepared using well known techniques for use in an eschelle configuration for the line narrowing of an excimer laser such as a KrF or ArF excimer laser. Seven invar rods 84 are attached with epoxy to the back of grating 82. Each of the rods pass through, (1) a piezoelectric transducer 86, (2) backing block 88 comprised of ULE material, (3) compression spring 90 and (4) nuts 92 all of which when assembled to pre-compress piezoelectric transducer 86 with a compression force of about 250 N. Backing block 84 is attached using epoxy on each and to invar baseplate 94. Preferably the rods, transducers, backing block, spring, and nuts are assembled and the precompression is supplied to each piezoelectric transducer before the rods are epoxied to the back of the grating.

Figure 9C:
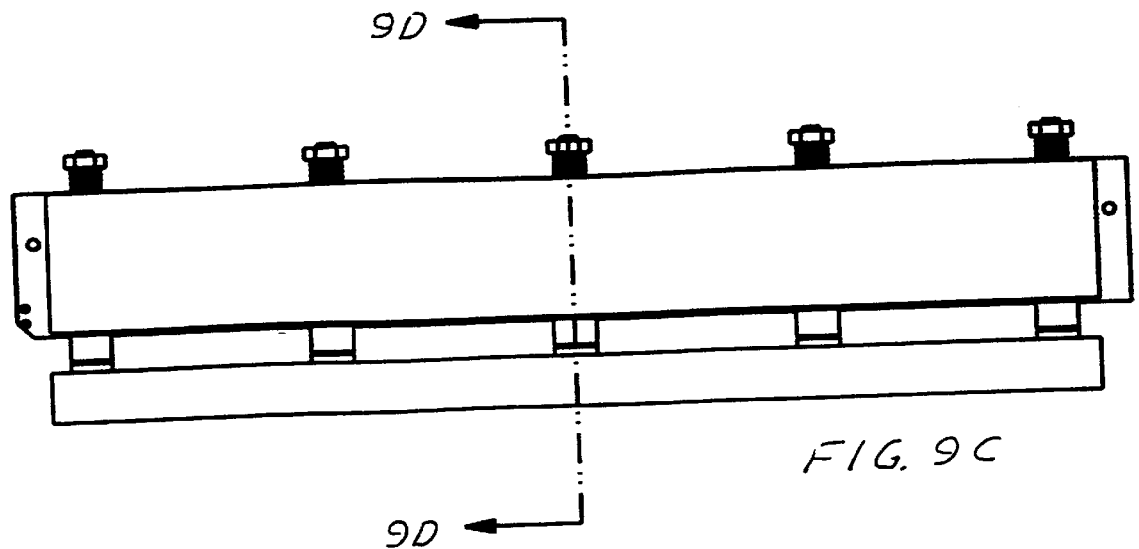
Figure 9D:
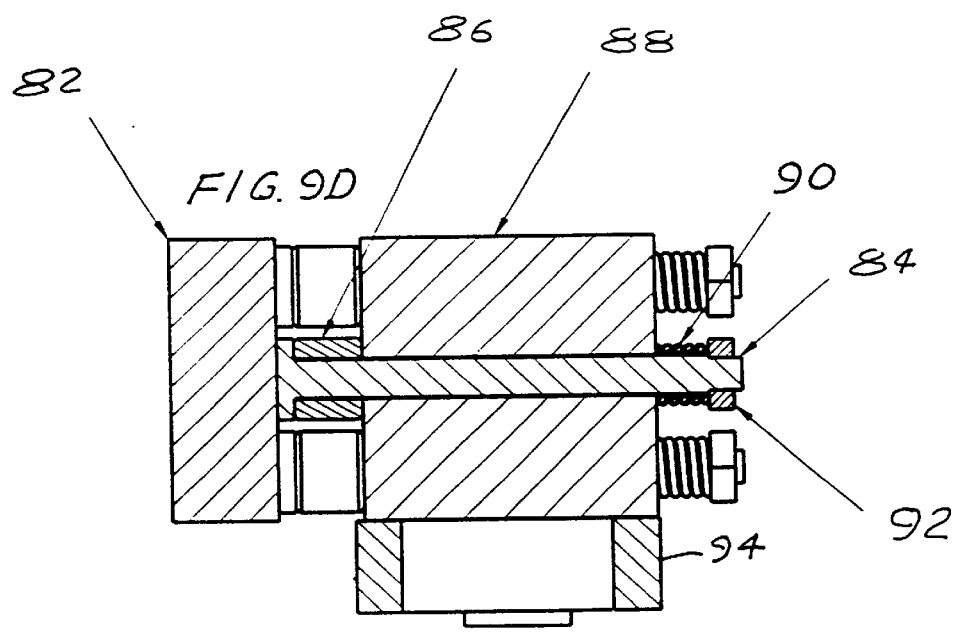

A recommended transducer 86 is Model P-305.00 available from Physik Instruments with offices in Germany with or Polytec Pi, Inc. with offices in Costa Mesa, Calif. The transducer has an ID of 5 mm and an OD of 10 mm and is 8 mm in length. It has a travel length of 5 $\mu$m with a 0–1000 V drive. Only a small fraction of this range is utilized so the 150 volt drive units (not shown) would normally be satisfactory. FIG. 9A shows a perspective view of the back of the grating assembly fully assembled and FIG. 9B shows a front perspective view and FIG. 9C shows a top view and FIG. 9D shows cross section at the 9D location shown in FIG. 9C.

Perspective sketches FIGS. 10A, 10B, 10C and 10D show very exaggerated results of applying various forces at the seven rod stations. Table I indicates the individual forces and the resulting displacements at each rod station. Thus, as shown in the sketches, this embodiment can shape the surface into shapes of (a) a twisted surface, (b) a W-curved surface, (c) a S-curve surface or (d) a concave surface. Obviously, many other shapes could be produced with this embodiment. The reader will also understand that additional piezoelectric drives could be used to provide additional degrees of surface control or fewer could be used to reduce complications and costs.

TABLE I

| Station | Concave Displacement | Concave Force | S Curve Displacement | S Curve Force | W Curve Displacement | W Curve Force | Twisted Displacement | Twisted Force |
|---|---|---|---|---|---|---|---|---|
| | (um) | (N) | (um) | (N) | (um) | (N) | (um) | (N) |
| 1s | 0 | 2.0 | 0.0 | −4.27 | 0.0 | 13.3 | 0.52 | 13.5 |
| 2s | 0 | 2.0 | 0.0 | −4.27 | 0.0 | −13.3 | −0.52 | −13.5 |
| 3s | −0.6 | −4.0 | 0.1 | 17.0 | 0.1 | 40.0 | 0.0 | 0.0 |
| 4s | −1.0 | 0.0 | 0.0 | 0.0 | 0.0 | −26.7 | 0.0 | 0.0 |
| 5s | −0.6 | −4.0 | −0.1 | −17.0 | 0.1 | 40.0 | 0.0 | 0.0 |
| 6s | 0 | 2.0 | 0.0 | 4.27 | 0.0 | −13.3 | −0.52 | −13.5 |
| 7s | 0 | 2.0 | 0.0 | 4.27 | 0.0 | −13.3 | 0.52 | 13.5 |

The present invention is valuable to two main purposes. First, many gratings after fabrication are not usable for effective laser wavelength control and line narrowing because of lack of flatness of the grating surface. Sometimes, this lack of flatness approximates a concave or convex shape and can be corrected with the embodiments shown in FIG. 4. But many times the grating has a twisted shape, W or S shape or other more complicated shape which the FIG. 4 embodiment could not fix. The present invention could returned many of these factory distorted shapes to a flat surface.

A second advantage of the FIG. 9 embodiment over the FIG. 4 embodiment results from the fact that the wavefront from the laser is often more complicated than merely flat, convex or concave so that good correction is not available with the FIG. 4 embodiment but would be available from the FIG. 9 embodiment.

A third advantage of the FIG. 9 embodiment over the FIG. 4 embodiment is that the curve correction in the FIG. 9 embodiment can be extremely fast. Adjustment can be made at intervals of about one millisecond or less.

Control of the PZT Deformable Grating

Various techniques can be used to control the surface of grating 82 to achieve desired results. In the lab a factory distorted grating surface can be monitored with an interferometer to determine its surface shape and the shape can be adjusted manually by trial and error to remove much of the distortion.

A better approach is to provide a feedback control of the positions of the driver rods to provide a grating surface needed for desired laser beam quality. A computer controlled feedback arrangement in which one or more beam parameters are monitored and data from this monitoring is used to control the positions of the seven driver rods. Many feedback control techniques are available for finding the best combination of piezoelectric rod position to produce the best beam quality. Some techniques of this type are described in the book by WH Press referred to earlier. A simple preferred technique would be to use the approach described above under the heading "An Example of an Optimization Technique". In this case the four beam parameters: energy efficiency, wavelength stability, energy stability and bandwidth would be used to control the position of the driver rods. Initially all seven rods would be adjusted to seek the best combined values based on the assigned W values. After the initial adjustment for faster control, either one or perhaps three rods could be adjusted under a fast feedback technique. Then at longer intervals all seven rods could be optimized. Alternatively, optimization times could be chosen based on operating events, such as after a gas injection.

Multiple Grating Sections

Figure 9E:
Figure 10A:
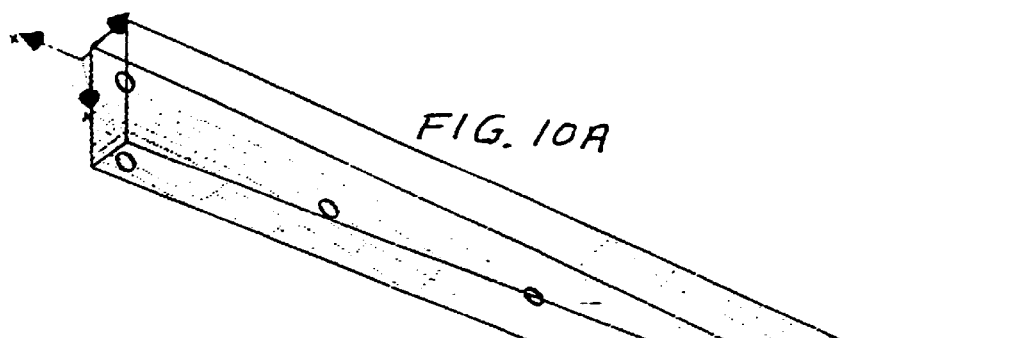
FIGS. 10A, B, C and D show deformed gratings.
Figure 10B:
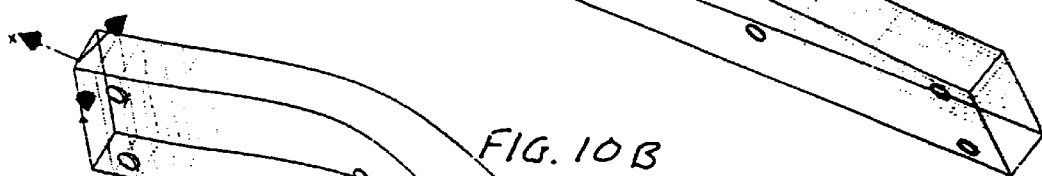
Figure 10C:
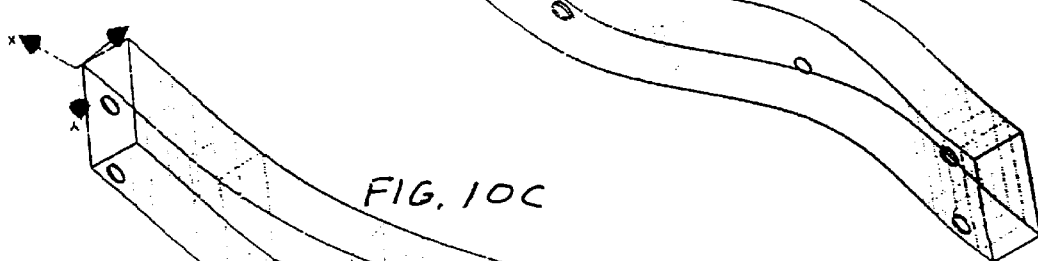
Figure 10D:
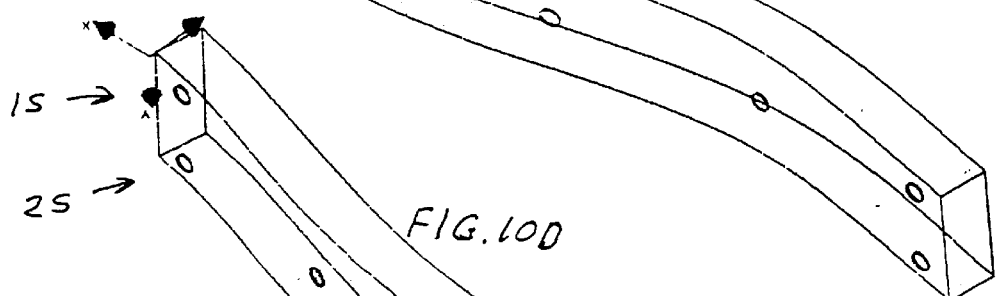

The precise control of the grating surface position of the grating assembly shown in FIGS. 9 and 9A, B, C, and D permits the combination of grating sections as shown in FIG. 9E to produce an effectively longer grating using multiple individual gratings. Fabrication of high quality gratings longer than about 10 inches is very difficult and aligning two separate gratings side by side so that the grating lines match up is extremely difficult. However, with the extremely fine control of the surface position of the assembly shown in FIGS. 9 and 9A, B, C, and D, two separate gratings can be easily combined to provide a longer grating using multiple individual gratings. Since the laser beam is illuminating the surface at an angle, any position error in the lengthwise direction of the gratings can be compensated for by a forward or backward adjustment of the surface of one of the gratings so that the differences in distance traveled by the laser beam in the beam direction between each of the lined reflecting surfaces of the grating sections are all equal to multiples of the target wavelength value.

Thus the two separately fabricated gratings are assembled as shown in FIG. 9 then carefully assembled end-to-end as shown in FIG. 9E. The PZT driver rods 84 then move one or both of the lined surfaces of the gratings until the lines of both gratings match up with each other so they are selecting the same narrow wavelength band.

PZT Deformable Mirror

Mirror 14 shown in FIG. 5 could be actively deformed using the techniques described above with reference to FIGS. 9 and 9A–D. Preferred techniques use to control the deformation of the mirror could also be similar to the techniques described above using beam quality feedback information.

Other Deformation Techniques

Other grating or mirror deformation techniques could be utilized. One such additional technique is shown in FIG. 9F. In this case piezo strain actuators 86A are used to cause very slight bending of grating mirror 82A. These strain type piezo wafers are available from Active Control experts, Inc. with offices in Cambridge, Mass. The wafers are applied in accordance with instructions from the piezo vendor.

Fast Tuning with Tuning Mirror

Figure 11A:
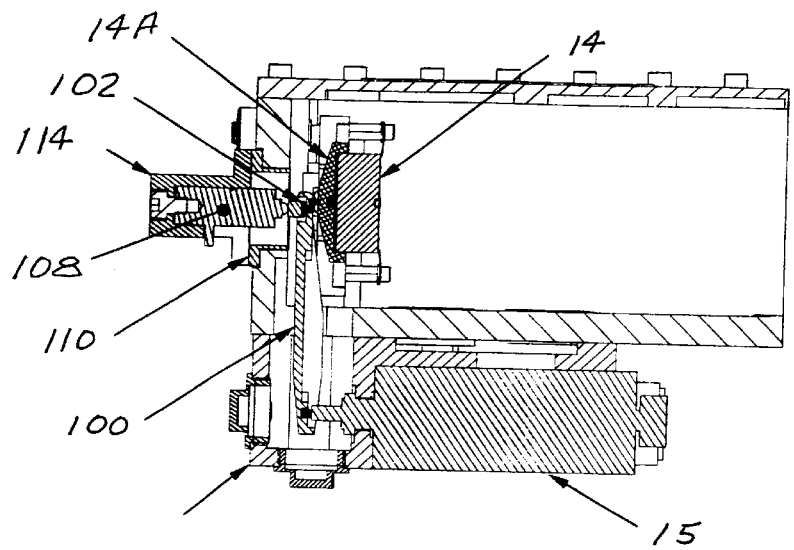
FIGS. 11A and B show a piezoelectric drive for a tuning mirror.
Figure 11B:
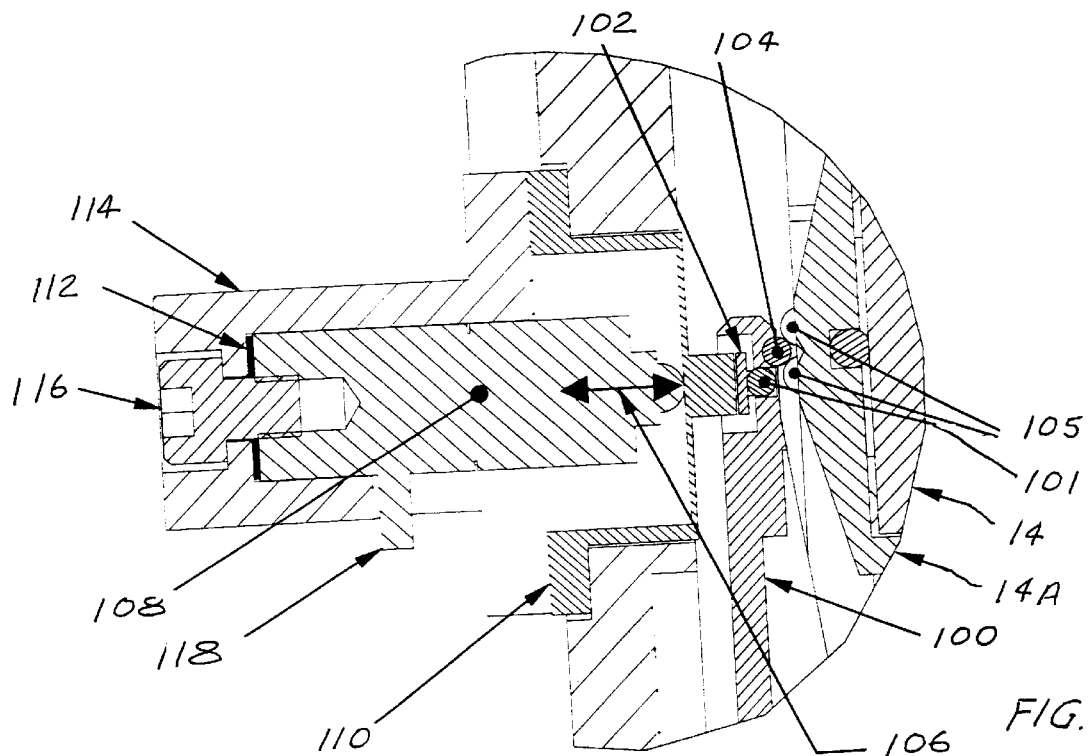

FIG. 11A and FIG. 11B show the features of a technique for very fast control of the tuning mirror 14 position. In this embodiment, stepper motor 15 pivots mirror 14 through the action of lever arm 100 which pivots on carbide ball 101 which rests on fulcrum block 102 to push dowel pin 104 against four carbide balls 105 attached to mirror mount 14A to produce very small movements of mirror 14. Even finer faster adjustment of mirror 14 is provided by the action, indicated by double headed arrow 106, of piezoelectric transducer 108 to cause very small changes in the position of fulcrum block 102. Drum 110 isolates piezoelectric transducer 108 from the ultraviolet and ultra clean environment inside the line narrow wing module. Also shown in FIG. 11B is glue bond 112 PZT mount 114 securing screw 116 and electrical connection 118.

Thus, the tuning equipment shown in FIGS. 11A and 11B give very fast mirror position control provided by the PZT drive) over a very limited radial range over the full required radial range is provided by the slower but greater range of stepper motor 15 and lever arm 100. Control of the mirror position is provided with a feedback computer controller based on center line wavelength measurements made of the output beam by beam output monitor 22 as shown in FIG. 2. Appropriate voltage may be applied to PZT drive 108 is to keep the wavelength values within a desired range and stepper motor lever arm may be positioned to keep the voltage driving PZT drive 108 within a desired range.

Although this invention has been disclosed and illustrated with reference to particular embodiments, the principals involved are susceptible for use in numerous other embodiments which will be apparent to persons skilled in the art. For example, each of the stepper motors could be replaced with alternative positioner units such as, ac or dc motors or hydraulic or pneumatic positioners. Many methods of controlling the positioners other than the suggested computer programs could be utilized. One or more stepper motors could be applied to the output coupler to automatically position it using similar techniques as described above for the $R_{MAX}$ mirror. Three strong permanent magnets could be used in the place of the two compression springs with one of the magnets replacing the piston as shown in FIG. 6. Magnet 60 is fixed to rod 4 and magnets 62 and 64 are fixed to housing 8. Rod 4 passes through holes in magnets 62 and 64. The effect of screwing rod 4 into and out of housing 8 is substantially the same as described above. The curvature of the grating could be accomplished using any of a large number of techniques. For example, compression or tension could be applied at a number of points to create virtually any shape desired and these shapes could be subject to feedback computer control. Also, the tuning mirror 14 could be a deformable mirror subject to deformation to any desired shape in order to correct wave front distortions. The deformation could be manual or it could be piezoelectric or motor controlled and as with the grating it could be controlled in a feedback circuit. The invention is therefore to be limited only as indicated by the scope of the appended claims and their legal equivalents.

We claim:

1. A smart narrow band electric discharge laser for producing an output laser beam said laser comprising:
   A) a laser frame;
   B) a laser chamber a adjustably mounted in said frame;
   C) a laser gas contained within said chamber;
   D) two elongated spaced apart electrodes contained within said chamber, said electrodes and laser gas between them defining gain medium;

E) an output coupler;
F) a line narrowing module comprising a prism beam expander, and a bendable grating defining a grating curvature, said line narrowing module and its optical components and the output coupler defining a resonant cavity;
G) a wavemeter for detecting laser beam parameters including at least pulse energy, wavelength and bandwidth;
H) a computer controller; and
I) a wavefront correction means controlled by said computer controller to adjust the grating curvature to shapes more complex then simple concave or simple convex, based on beam quality information provided to said computer controller by said wavemeter.

2. A smart laser as in claim 1 and further comprising an $R_{Max}$ mirror for controlling the center wavelength.

3. A smart laser as in claim 1 and further comprising a chamber positioner system for positioning said chamber in a horizontal direction so that said gain medium is in a desired position with respect to the resonant cavity.

4. A smart laser as in claim 3 wherein the computer controller is programmed to control said chamber positioner unit to position said chamber based on feedback information from said wavemeter.

5. A smart laser as in claim 1 wherein said prism beam expander comprises a plurality of prisms disposed on a prism plate, and further comprising a prism plate positioner unit for positioning said prism plate.

6. A smart laser as in claim 5 wherein said computer controller is programmed to control said prism plate positioner unit to position said prism plate based on feedback information from said wavemeter.

7. A smart laser as in claim 1 and further comprising an $R_{MAX}$ tilt positioner to tilt said $R_{MAX}$ mirror to control vertical spatial parameters of said output laser beam.

8. A smart laser as in claim 6 wherein said computer controller is programmed to control said tilt positioner to tilt said $R_{MAX}$ mirror based on beam information from said wavemeter.

9. A smart laser as in claim 1 wherein said beam expander comprises a plurality of prisms disposed on a movable prism plate and further comprising:

A) a chamber positioner unit for positioning said chamber in a horizontal direction upon control signals from said computer controller;
B) a prism plate positioning unit for positioning said prism plate upon control signals from said computer controller;
C) an $R_{MAX}$ tilt positioner to tilt said $R_{MAX}$ mirror based upon control signals from said computer controller; and
D) an $R_{MAX}$ pivot positioner to pivot said $R_{MAX}$ mirror to adjust nominal wavelength of said output beam based on control signals from said computer controller.

10. A smart laser as in claim 1 wherein said grating curvature positioner comprises a stepper motor.

11. A smart laser as in claim 3 wherein said chamber positioner system comprises at least one stepper motor.

12. A smart laser as in claim 3 wherein said chamber positioner system comprises at least two drive units configured to permit an angular alignment of said gain medium with respect to an axis of said resonant cavity.

13. A smart laser as in claim 5 wherein said prism plate positioner is a stepper motor.

14. A smart laser as in claim 7 wherein said $R_{MAX}$ tilt positioner is a stepper motor.

15. A smart laser as in claim 9 wherein all of said positioners are stepper motors.

16. A smart laser as in claim 1 wherein said wavefront correction means comprises a deformable grating.

17. A smart laser as in claim 16 wherein said deformable grating comprises at least three piezoelectric devices.

18. A smart laser as in claim 17 wherein said at least three piezoelectric devices is at least seven piezoelectric devices.

19. A smart laser as in claim 16 wherein said deformable grating is deformable into an S shape.

20. A smart laser as in claim 16 wherein said deformable grating is deformable into a W shape.

21. A smart laser as in claim 16 wherein said deformable grating is deformable into a twisted shape.

22. A smart laser as in claim 17 wherein said deformable grating comprises two separately fabricated lined grating sections wherein at least one of said lined sections comprise at least three piezoelectric devices wherein said at least three piezoelectric devices are utilized to co-align the two grating sections to function as a single grating.

\* \* \* \* \*